(12) United States Patent
Chopin et al.

(10) Patent No.: US 9,426,884 B2
(45) Date of Patent: Aug. 23, 2016

(54) SYSTEM AND METHOD FOR LEAD FRAME PACKAGE DEGATING

(71) Applicants: Sheila F. Chopin, Round Rock, TX (US); Varughese Mathew, Austin, TX (US)

(72) Inventors: Sheila F. Chopin, Round Rock, TX (US); Varughese Mathew, Austin, TX (US)

(73) Assignee: FREESCALE SEMICONDUCTOR, INC., Austin, TX (US)

(*) Notice: Subject to any disclaimer, the term of this patent is extended or adjusted under 35 U.S.C. 154(b) by 402 days.

(21) Appl. No.: 13/950,618

(22) Filed: Jul. 25, 2013

(65) Prior Publication Data
US 2015/0027767 A1    Jan. 29, 2015

(51) Int. Cl.
| | |
|---|---|
| H05K 1/11 | (2006.01) |
| H05K 1/05 | (2006.01) |
| H05K 3/28 | (2006.01) |
| H01L 21/56 | (2006.01) |
| H01L 21/48 | (2006.01) |
| H01L 23/495 | (2006.01) |
| H01L 23/31 | (2006.01) |
| H01L 23/00 | (2006.01) |

(52) U.S. Cl.
CPC .............. *H05K 1/05* (2013.01); *H01L 21/4821* (2013.01); *H01L 21/56* (2013.01); *H01L 23/49586* (2013.01); *H05K 1/111* (2013.01); *H05K 3/28* (2013.01); *H01L 23/3107* (2013.01); *H01L 23/49541* (2013.01); *H01L 24/97* (2013.01); *H01L 2924/15747* (2013.01); *H01L 2924/1815* (2013.01); *Y10T 29/49121* (2015.01)

(58) Field of Classification Search
CPC ......... H05K 3/28; H05K 3/281; H05K 3/282; H05K 3/284; H05K 3/285; H05K 1/05; H05K 1/053; H05K 1/111
See application file for complete search history.

(56) References Cited

U.S. PATENT DOCUMENTS 6,034,422 A * 3/2000 Horita et al. .................. 257/677
7,264,456 B2   9/2007 Williams et al.

* cited by examiner

*Primary Examiner* — Jeremy C Norris

(57) ABSTRACT

A method of forming an electronic component includes masking a lead frame to form a mask defining an exposed area, oxidizing the exposed area of the lead frame, wherein the mask inhibits oxidation of an unexposed area, and removing the mask from the lead frame following oxidizing. A lead frame can include a metal sheet patterned to define a pad region and leads. The metal sheet includes metal oxide in a select area. The pad region is substantially free of metal oxide.

20 Claims, 4 Drawing Sheets

SYSTEM AND METHOD FOR LEAD FRAME PACKAGE DEGATING

FIELD OF THE DISCLOSURE

This disclosure, in general, relates to methods and systems for treating lead frames and methods and systems for forming electronic components using such treated lead frames.

BACKGROUND

To form an electronic component, a die can be placed on a lead frame and a molding compound can be applied over the die and the lead frame. Once cured, the mold compound encapsulates the die and a portion of the lead frame. In addition, superfluous cured mold compound remains in contact with the lead frame in regions associated with distributing the mold compound to encapsulate the die on a multi-die lead frame. Such superfluous mold compound is removed from the lead frame, conventionally referred to as degating, prior to further processing to form electronic component.

When the superfluous mold compound is removed from the lead frame, oftentimes the lead frame is distorted. Different mold compounds adhere to the lead frame with differing strengths. Adhesion of a mold compound to the lead frame can depend on curing conditions and surface conditions of the lead frame. When the superfluous mold compound is removed from the lead frame, the lead frame can be bent or warped, adversely affecting downstream processing. For example, a warped or bent lead frame may not fit into a shelf or slot in downstream equipment or may cause misalignment with cutters or other processing equipment, leading to lower yield of the final electronic component.

As such, an improved process for encapsulating dies and degating from a lead frame would be desirable.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

In an exemplary embodiment, a method of forming electronic components includes treating a lead frame to reduce adhesion of a mold compound to the lead frame in an area associated with a runner or gate. The runner area is a region of the lead frame across which mold compound flows to the gate area. The gate area acts as a region connecting the runner area over which the mold compound flows to the die pad area at a section of the lead frame to be encapsulated by the mold compound. The method of treating a lead frame can include masking the lead frame to leave an exposed area corresponding with at least a runner area or a gate area, oxidizing the exposed area of the lead frame, and removing a mask from the lead frame following oxidizing. In particular, masking the lead frame can include using a photoresist and a photolithography process to mask areas of the lead frame that are to be protected during the oxidation process. Oxidizing can include electrochemical oxidizing, plasma oxidizing, wet oxidizing, variations thereof or combination thereof. Oxidizing can include oxidizing to an oxide thickness of at least 18 nm or to not greater than 10 p.m. Following oxidation, the photoresist can be removed, for example using a chemical rinse or another technique. The method of forming an electronic component can further include applying a die to the lead frame, applying a mold compound to the treated lead frame and die in a mold, removing a runner and gate formed of cured molding compound and separating an electronic component from the lead frame.

Figure 1:
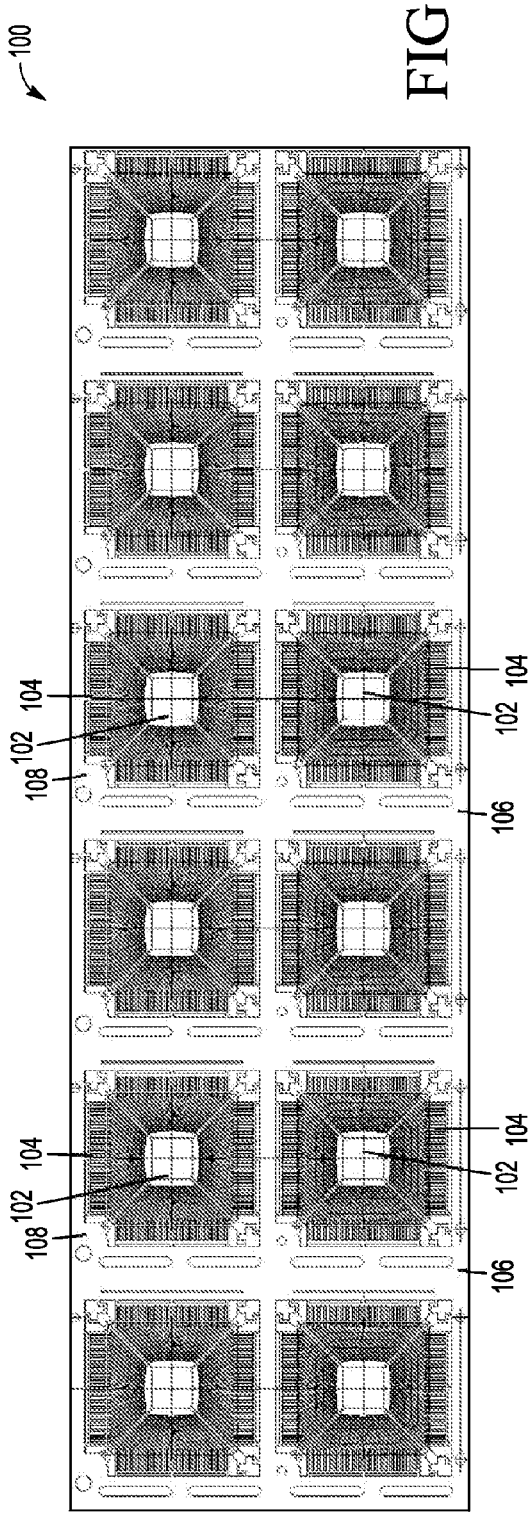
FIG. 1 includes an illustration of an exemplary lead frame.

FIG. 1 includes an illustration of an exemplary lead frame 100 that includes multiple pad sites 102 onto which a die can be disposed. In the illustrated lead frame 100, leads extend toward the die pad 102. A pattern of external leads 104 attached to the frame can be cut to form leads external to the encapsulated die. Between the pads 102 is a region of the lead frame over which mold compound flows when the mold surrounds the die. For example, the mold compound can flow along a runner region 106 to a gate region 108. From the gate region 108, the mold compound flows into a cavity of the mold overlying or surrounding the die 102 and a portion of the leads.

Figure 2:
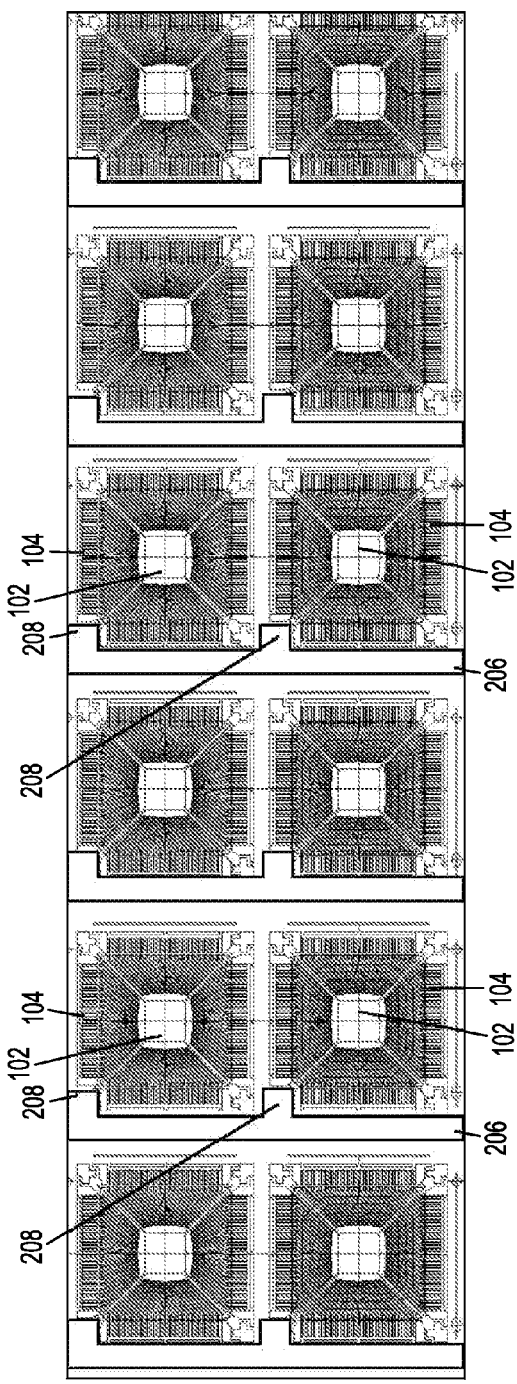
FIG. 2 includes an illustration of exemplary treated lead frame.
Figure 4:
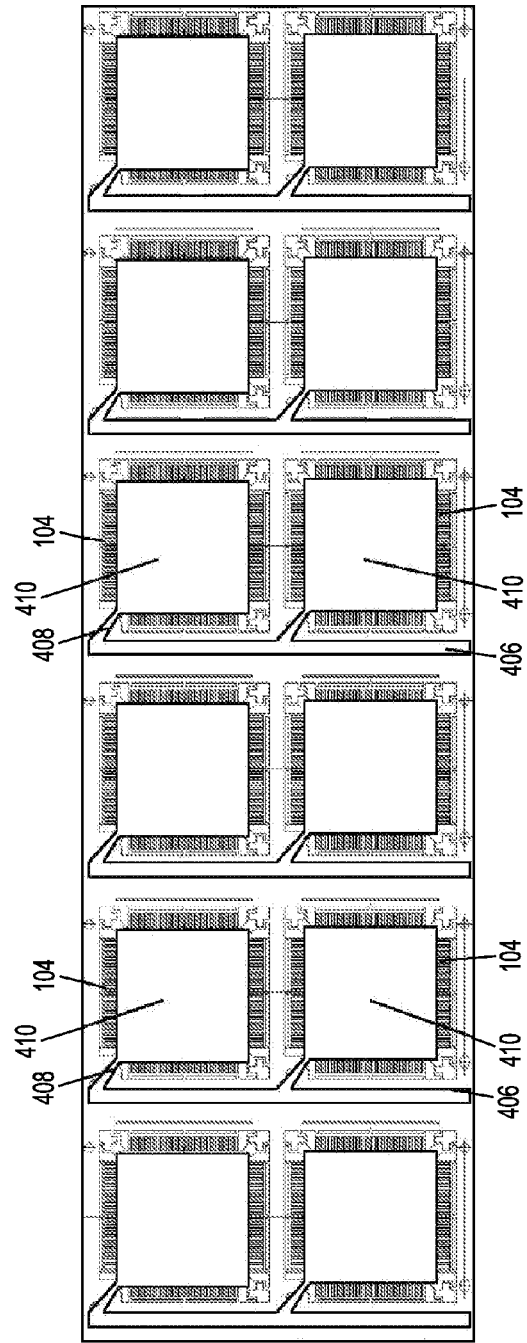
FIG. 4 includes an illustration of exemplary lead frame following a mold process.

While FIG. 1, FIG. 2 and FIG. 4 illustrate a particular lead frame with a particular lead design, lead frames of other designs can be used in the described process.

In an example, the lead frame 100 can be masked to leave the exposed area that includes at least the runner area or the gate area exposed. In particular, the die pad, inner leads, tie bars and external leads are masked. For example, the lead frame can be coated with a photoresist. The photoresist can be patterned and developed, for example, using a photomask and etching to expose the region of the lead frame including at least the runner area 106 or the gate area 108.

The exposed areas of lead frame 100 can be oxidized. For example, the exposed region can be electrochemically oxidized. In another example, the exposed region can be plasma oxidized. In a further example, the exposed region can be wet chemical oxidized. The mask protects the die pad region, tie bars, and the inner and external leads and the protected regions are substantially free of metal oxide.

Following oxidation, remaining photoresist can be removed, providing a lead frame, as illustrated in FIG. 2, with an oxidized runner area 206 or gate area 208. The lead frame 100 can be further washed and taped for later use.

Figure 3:
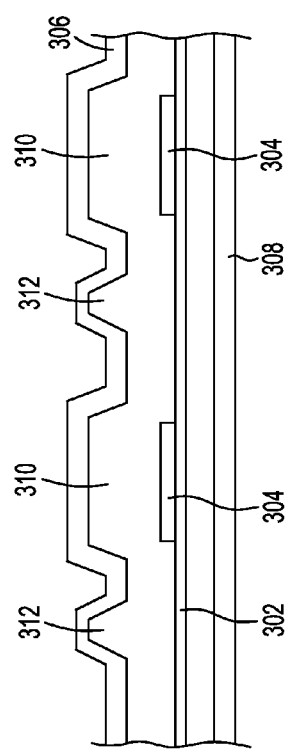
FIG. 3 includes an illustration of exemplary mold system.

As illustrated in FIG. 3, a die 304 can be applied to the lead frame 302. For example, the die can be attached to the lead frame 302 using an adhesive. The die 304 can be electrically coupled to the leads of the lead frame 302 using wire bonding techniques or using a solder ball technique.

The lead frame 302 and die 304 can be applied between portions (306 or 308) of the mold. In particular, the mold 306 cross-section defines a volume 310 to be filled with a mold compound to encapsulate the die 304 and can define a volume 312 that permits the flow of mold compound across the lead frame to gate regions through which the mold compound flows into the volume 310.

Following curing the mold compound and cooling the lead frame, the encapsulated die 410 is formed. In addition, superfluous mold compound forms a runner 406 or gate 408 that is to be removed prior to further processing the lead frame and encapsulated die. Because the runner 406 or gate 408 are formed over oxidized portions of the lead frame, the superfluous mold compound exhibits reduced adhesion to the lead frame and is easier to remove or break from the lead frame, limiting damage such as warping or bending the lead frame. The lead frame and encapsulated die can be further processed, and the encapsulated die can be separated from the lead frame forming an electronic component.

Figure 5:
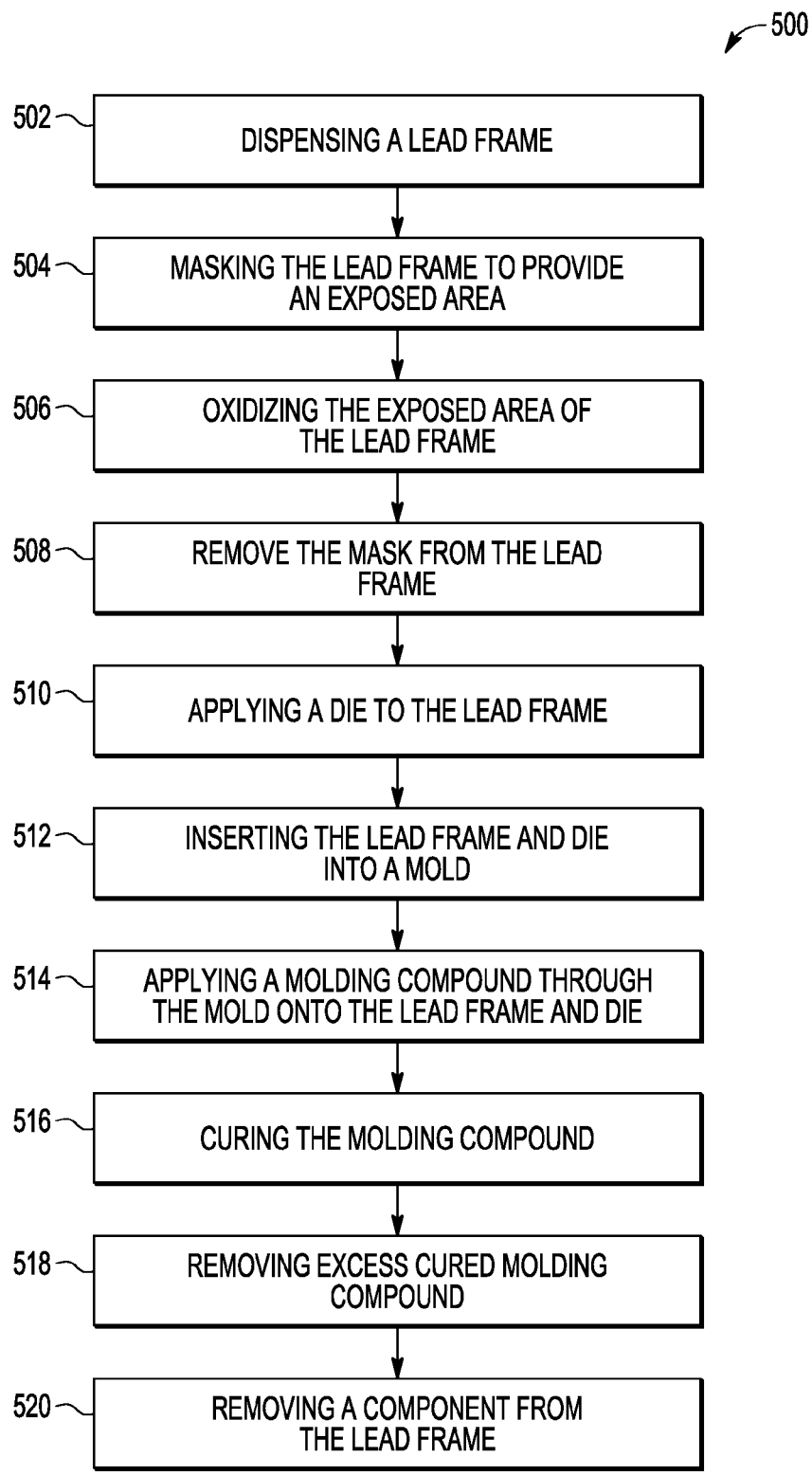
FIG. 5 includes a flow diagram illustrating an exemplary method for forming an electronic component.

In an embodiment, FIG. 5 illustrates a flow diagram of a method 500 that includes providing (e.g., dispensing from a cart or stack) a lead frame, as set forth at 502. In an example, a metal lead frame, such as a copper lead frame, is dispensed. The lead frame, for example, includes a die pad region and leads. The leads can be coupled at one end and extend toward the die pad region. In particular, the lead frame can include a die pad region and can include inner lead extensions to be encapsulated that extend from outer lead extensions that are not to be encapsulated. Dies attached in the die pad region can be wire bound to the inner leads. In an example, the die pad region can include more than one die pads to receive more than one die to be encapsulated together.

The lead frame can be masked to provide an exposed area, as set forth at 504. In particular, the lead frame can be masked to provide a masked area including at least the die pad region, inner lead extensions, the tie bars, and the outer lead extensions. An area left exposed by the mask can include at least a runner area or a gate area. The runner area provides a region of the lead frame across which mold compound flows to the gate area. The gate area acts as a region connecting the runner area through which the mold compound flows with the die pad cavity area around the section of the lead frame to be encapsulated by the mold compound.

In a particular example, the lead frame can be masked using photoresist and a photolithography process. For example, a photoresist can be coated over the lead frame. The photoresist can be patterned such as by exposure to a masked light source, for example, an ultraviolet light source. The resist can be etched to remove resist from the region to be exposed, including in particular, the runner area and the gate area.

As set forth at 506, the exposed area of the lead frame can be oxidized. For example, the exposed area of the lead frame can be oxidized to a metal oxide thickness of at least 18 nm. In an example, the oxide thickness may be not greater than 10 µm. In particular, the oxide can have a thickness in a range of 20 nm to 250 nm, such as a range of 20 nm to 150 nm, a range of 20 nm to 100 nm, or even a range of 40 nm to 100 nm. In contrast, the protected areas, including at least the pad region, are substantially free of metal oxide, for example, having not more than 10 nm metal oxide, such as not more than 5 nm metal oxide, not more than 1 nm metal oxide, or even little detectable metal oxide.

In a particular example, oxidizing can include electrochemical oxidizing. For example, the masked lead frame can be placed into a plating bath and connected to form an electrode through which current passes. For example, the plating bath can include a basic solution, for example, having a pH greater than 7, such as a pH of at least 8, or a pH of at least 9. In particular, the plating bath can include a strong base such as sodium hydroxide or tetraalkyl ammonium hydroxide. Electric current can be applied to the system, for example, resulting in an electric current density over the lead frame in a range of 0.5 A/dm$^2$ to 5 A/dm$^2$, such as a range of 0.5 A/dm$^2$ to 2 A/dm$^2$. Following electrochemical oxidation, the lead frame can be washed to remove remnants of the basic solution and can be dried.

In another example, oxidizing includes exposing the lead frame to a plasma such as an oxygen-containing plasma. In the presence of oxygen-containing plasma, a copper surface of a copper lead frame can become oxidized. Photoresist may begin to degrade or etch when exposed to the plasma. As such, the photoresist is applied to a thickness sufficient to provide at least some resistance to oxidation until the desired thickness of oxide is formed in the exposed regions of the lead frame.

In a further example, oxidation includes wet chemical oxidation, for example, exposing the lead frame to an oxidizing chemical bath. In an example, the oxidizing chemical bath includes an oxidizing agent such as sodium chlorite, sodium hypochlorite, sodium permanganate, variations thereof or combinations thereof.

The lead frame can be formed by a stamping process. For example, a sheet of material can be stamped and plated. Following plating, the lead frame can be taped and cut. In an example, the lead frame can be selectively oxidized following plating and prior to taping. In another example, the lead frame can be etched. For example, a resist coating can be applied, exposed and developed to define a particular lead frame pattern. The lead frame can then be etched to impart the pattern to the lead frame, and remaining resist can be stripped from the lead frame. Optionally, the lead frame can be subdivided or separated followed by plating. Following plating, the lead frame can be taped and down set. Optionally, the lead frame can be selectively oxidized as described herein following plating and prior to taping.

As set forth at 508, the remaining photoresist can be removed from the lead frame, leaving a pattern of oxidized and non-oxidized regions. Depending upon the nature of the photoresist, the photoresist may be chemically removed and washed from the lead frame.

As set forth at 510, a die can be applied to the lead frame. A die can be applied to the die pad and can be electrically coupled to the leads. In an example, the die can be adhered to the die pad using an adhesive and can be electrically coupled to the leads using wire bonds or other conductive structures. Alternatively, the die pad can include solder ball pads and solder balls can be used to electrically connect the die to the leads. In a further example, the lead frame can define a die pad region that includes more than one die pad. More than one die can be placed within a die pad region including multiple die pads.

The lead frame and the bonded die is inserted into a mold, as set forth at 512, and a mold compound can be applied through the mold onto the lead frame and die, as set forth at 514. In particular, the mold can include volumes encapsulating the die and can include volumes through which mold compound is applied and gated into the volumes encapsulating the die. For example, the mold defines runner and gate volumes disposed over the oxidized runner and gate areas of the lead frame and through which an encapsulant material flows to the encapsulating volume before curing.

In an example, the mold compound can include an encapsulant material, such as an epoxy, a silicone compound, a polyurethane compound, or a combination thereof. In a particular example, the mold compound is the cured encapsulant material.

Depending on the nature the mold compound, the mold compound can be cured or hardened, as set forth at 516. Alternatively or in addition, the mold compound can be cooled forming a solid material encapsulating the die. In addition, such curing and cooling leaves superfluous mold compound forming a runner or a gate. Such superfluous and excess cured mold compound is removed, for example, through a degating process, as set forth at 518. For example, the superfluous mold compound can be broken, sheared, or peeled from the surface of the lead frame, in particular those surfaces including oxidation.

Once the superfluous captured mold compound is removed from the lead frame, the lead frame and encapsulated die can be further processed. For example, an electronic component can be separated from the lead frame, as set forth at 520, into individual electronic components.

EXAMPLE

Figure 6:
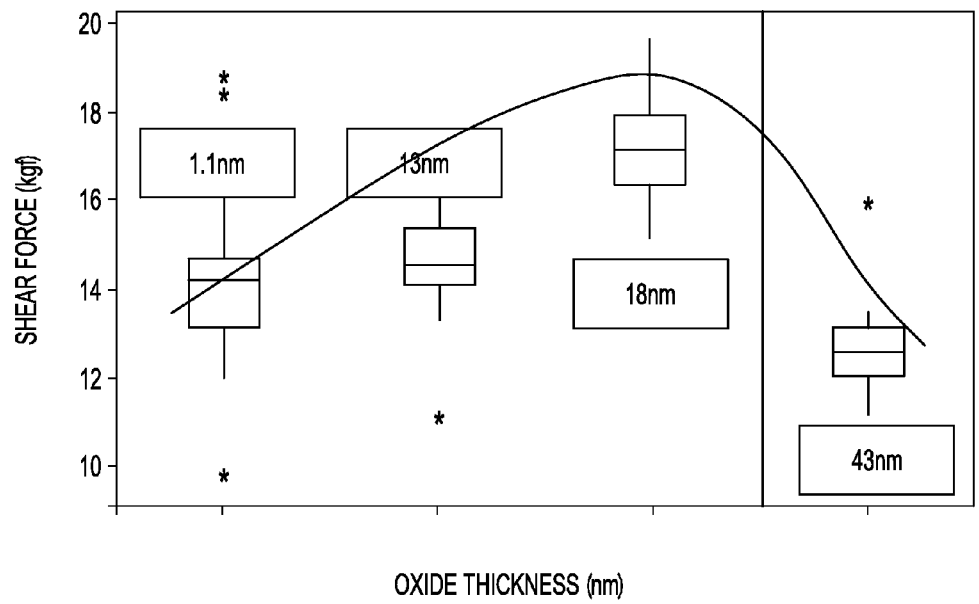
FIG. 6 includes a graph illustrating the influence of oxidation on mold compound adhesion.
Figure 7:
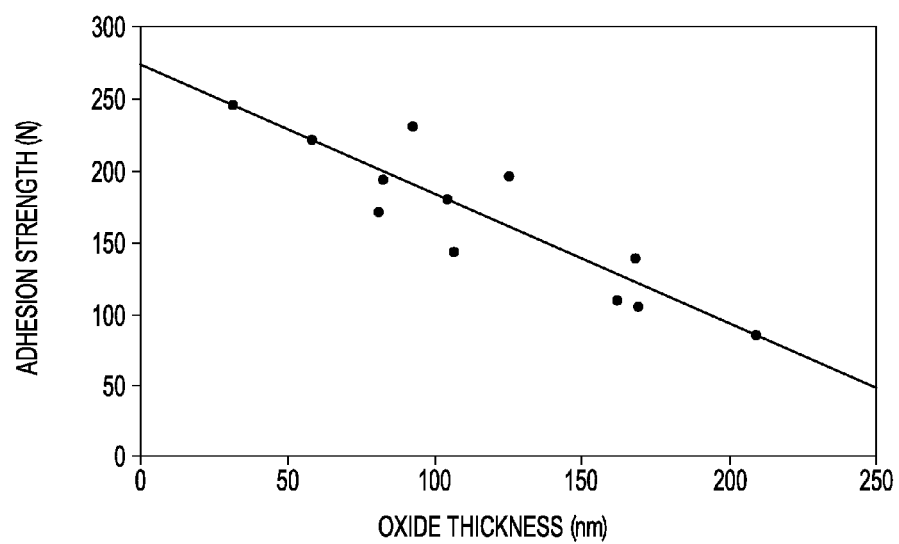
FIG. 7 includes a graph illustrating the influence of oxidation on mold compound adhesion to the lead frame.

As illustrated in the exemplary embodiment of FIG. 6, adherence of a mold compound to a lead frame exhibits diminishing strength at an oxidation thickness of greater than 18 nm. In an example, a copper lead frame (CDA194) is oxidized by exposure to air while heating at 200° C. for between 2 and 7 minutes. A low molecular weight epoxy-based compound and a bis-phenol epoxy-based compound are bonded to the oxidized lead frame and tested for shear strength using a cup shear technique. The thickness of the oxide is determined using Secondary Ion Mass (SIM) spectrometry analysis. In particular, as illustrated in FIG. 6, a lead frame shear strength drops dramatically with oxide thicknesses greater than 20 nm and drops below initial sheer strength at a thickness greater than 40 nm. FIG. 7 further demonstrates that adhesion strength falls with oxide thicknesses greater than 20 nm and particularly oxide thicknesses in a range between 20 and 250 nm.

In a first aspect, a method of forming an electronic component includes masking a lead frame to form a mask defining an exposed area corresponding with at least a runner or gate area, oxidizing the exposed area of the lead frame, and removing the mask from the lead frame following oxidizing.

In an example of the first aspect, oxidizing includes oxidizing to an oxide thickness of greater than 18 nm and not greater than 10 micrometers. For example, the oxide thickness is in a range of 20 nm to 250 nm.

In another example of the first aspect and the above examples, oxidizing includes electrochemical oxidizing. For example, electrochemical oxidizing includes exposing the lead frame to a basic solution and an electric current density in a range of 0.5 A/dec$^2$ to 5 A/dec$^2$.

In a further example of the first aspect and the above examples, oxidizing includes exposing the lead frame to a plasma. For example, the plasma is an oxygen-containing plasma.

In an additional example of the first aspect and the above examples, oxidizing includes wet oxidizing. For example, wet oxidizing includes exposing the lead frame to an oxidizing chemical bath. In an example, the oxidizing chemical bath includes sodium chlorite, sodium hypochlorite, or sodium permanganate.

In another example of the first aspect and the above examples, the method further includes applying a molding compound over the lead frame in a mold, the molding compound forming a runner or gate, and removing the runner or gate. In an example, the method further includes separating an electronic component from the lead frame.

In a further example of the first aspect and the above examples, masking includes patterning a photoresist on the lead frame. In an example, removing the mask includes removing the patterned photoresist.

In a second aspect, a lead frame includes a metal sheet patterned to define a pad region and leads. The patterned metal sheet includes metal oxide in an area corresponding to a runner or gate region. The pad region is substantially free of metal oxide.

In an example of the second aspect, the metal sheet includes copper.

In another example of the second aspect and the above examples, the metal oxide has a thickness of at least 18 nm and not greater than 10 micrometers. For example, the thickness is in a range of 20 nm to 250 nm.

In a third aspect, an electronic component is formed by a method including masking a lead frame to form a mask defining an exposed area corresponding with at least a runner or gate area, oxidizing the exposed area of the lead frame, and removing the mask from the lead frame following oxidizing.

In an example of the third aspect, the method further includes applying a molding compound over the lead frame in a mold, the molding compound forming a runner or gate, and removing the runner and gate.

In a fourth aspect, a method of forming an electronic component includes masking a lead frame to form a mask defining an exposed area, oxidizing the exposed area of the lead frame, wherein the mask inhibits oxidation of an unexposed area, and removing the mask from the lead frame following oxidizing.

In an example of the fourth aspect, the exposed area corresponds to a runner area or gate area.

In another example of the fourth aspect and the above examples, oxidizing includes oxidizing to an oxide thickness of greater than 18 nm and not greater than 10 micrometers. For example, the oxide thickness can be in a range of 20 nm to 250 nm.

In a further example of the fourth aspect and the above examples, oxidizing includes exposing the lead frame to an oxygen-containing plasma.

In an additional example of the fourth aspect and the above examples, oxidizing includes wet oxidizing in an oxidizing chemical bath including a reagent selected from the group consisting of sodium chlorite, sodium hypochlorite, and sodium permanganate.

In another example of the fourth aspect and the above examples, the method further includes applying a molding compound to the lead frame and removing cured mold compound from the oxidized exposed area. In another example, the method further includes separating an electronic component from the lead frame.

In a further example of the fourth aspect and the above examples, masking includes patterning a photoresist on the lead frame.

In a fifth aspect, a lead frame includes a metal sheet patterned to define a pad region and leads. The patterned metal sheet includes metal oxide in a select area. The pad region is substantially free of the metal oxide.

In an example of the fifth aspect, the select area corresponds to a runner area or gate area. In another example of the fifth aspect and the above examples, the metal sheet includes copper.

In a further example of the fifth aspect and the above examples, the metal oxide has a thickness of at least 18 nm and not greater than 10 micrometers. For example, the thickness is in a range of 20 nm to 250 nm.

In a sixth aspect, a method of forming an electronic component includes attaching a die to a lead frame. The lead frame includes a first surface area having metal oxide and a second surface area substantially free of metal oxide. The die is attached to the second surface area. The method further includes inserting the die and the lead frame into a mold, applying a mold compound to the first and second surface areas, the mold compound encapsulating the die, and removing the mold compound from the first surface area of the lead frame.

In an example of the sixth aspect, the first area corresponds to a runner area or a gate area. In another example of the sixth aspect and the above examples, the first area corresponds to a die pad region.

In a further example of the sixth aspect and the above examples, the first area has a metal oxide thickness of greater than 18 nm and not greater than 10 micrometers. For example, the metal oxide thickness can be in a range of 20 nm to 250 nm.

In an additional example of the sixth aspect and the above examples, the method further includes separating the encapsulated die from the lead frame.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

After reading the specification, skilled artisans will appreciate that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. A lead frame comprising a metal sheet patterned to define a plurality of pad sites, each pad site of the plurality of pad sites including a pad region and leads, a runner area defined between two pad sites of the plurality of pad sites, the patterned metal sheet including metal oxide in a select area corresponding to at least the runner area, the pad region substantially free of the metal oxide.

2. The lead frame of claim 1, wherein the select area corresponds to the runner area and a gate area.

3. The lead frame of claim 1, wherein the metal sheet includes copper.

4. The lead frame of claim 1, wherein the metal oxide has a thickness of at least 18 nm and not greater than 10 micrometers.

5. The lead frame of claim 4, wherein the thickness is in a range of 20 nm to 250 nm.

6. A method of forming an electronic component, the method comprising:
    masking a lead frame to form a mask defining an exposed area;
    oxidizing the exposed area of the lead frame, wherein the mask inhibits oxidation of an unexposed area; and
    removing the mask from the lead frame following oxidizing.

7. The method of claim 6, wherein the exposed area corresponds to a runner area or gate area.

8. The method of claim 6, wherein oxidizing includes oxidizing to an oxide thickness of greater than 18 nm and not greater than 10 micrometers.

9. The method of claim 8, wherein the oxide thickness is in a range of 20 nm to 250 nm.

10. The method of claim 6, wherein oxidizing includes exposing the lead frame to an oxygen-containing plasma.

11. The method of claim 6, wherein oxidizing includes wet oxidizing in an oxidizing chemical bath including a reagent selected from the group consisting of sodium chlorite, sodium hypochlorite, and sodium permanganate.

12. The method of claim 6, further comprising:
    applying a molding compound to the lead frame; and
    removing cured mold compound from the oxidized exposed area.

13. The method of claim 12, further comprising separating an electronic component from the lead frame.

14. The method of claim 6, wherein masking includes patterning a photoresist on the lead frame.

15. A method of forming an electronic component, the method comprising:
    attaching a die to a lead frame, the lead frame including a first surface area having metal oxide and a second surface area substantially free of metal oxide, the die attached to the second surface area;
    inserting the die and the lead frame into a mold;
    applying a mold compound to the first and second surface areas, the mold compound encapsulating the die; and
    removing the mold compound from the first surface area of the lead frame.

16. The method of claim 15, wherein the first area corresponds to a runner area or a gate area.

17. The method of claim 15, wherein the first area corresponds to a die pad region.

18. The method of claim 15, wherein the first area has a metal oxide thickness of greater than 18 nm and not greater than 10 micrometers.

19. The method of claim 18, wherein the metal oxide thickness is in a range of 20 nm to 250 nm.

20. The method of claim 15, further comprising separating the encapsulated die from the lead frame.

* * * * *